United States Patent
Wang et al.

(10) Patent No.: US 11,009,547 B2
(45) Date of Patent: May 18, 2021

(54) DEVICE AND METHOD FOR TESTING A COMPUTER SYSTEM

(71) Applicant: SUPER MICRO COMPUTER, INC., San Jose, CA (US)

(72) Inventors: Mao Sui Wang, San Jose, CA (US); Pao-Ting An, New Taipei (TW)

(73) Assignee: SUPER MICRO COMPUTER, INC., San Jose, CA (US)

( * ) Notice: Subject to any disclaimer, the term of this patent is extended or adjusted under 35 U.S.C. 154(b) by 0 days.

(21) Appl. No.: 16/212,295

(22) Filed: Dec. 6, 2018

(65) Prior Publication Data
US 2020/0182932 A1 Jun. 11, 2020

(51) Int. Cl.
| | | |
|---|---|---|
| G01R 31/317 | (2006.01) | |
| G06F 13/42 | (2006.01) | |
| G01R 31/3177 | (2006.01) | |
| G01R 31/327 | (2006.01) | |

(52) U.S. Cl.
CPC ... G01R 31/31715 (2013.01); G01R 31/3177 (2013.01); G06F 13/4282 (2013.01); G06F 2213/0026 (2013.01)

(58) Field of Classification Search
CPC .......... G01R 31/31715; G01R 31/3177; G06F 13/4282; G06F 2213/0026
See application file for complete search history.

(56) References Cited

U.S. PATENT DOCUMENTS

| | | | | |
|---|---|---|---|---|
| 5,355,369 | A * | 10/1994 | Greenberger | G06F 11/267 714/724 |
| 5,828,824 | A * | 10/1998 | Swoboda | G01R 31/31705 714/25 |
| 6,571,360 | B1 * | 5/2003 | Drogichen | G06F 11/2733 714/40 |
| 7,685,380 | B1 * | 3/2010 | Khu | G06F 12/0246 711/102 |
| 2001/0023490 | A1* | 9/2001 | Gloeckler | G06F 11/2236 714/30 |
| 2003/0110344 | A1* | 6/2003 | Szczepanek | H04L 12/40013 711/100 |
| 2003/0229835 | A1* | 12/2003 | Whetsei | G01R 31/318541 714/727 |
| 2009/0006915 | A1* | 1/2009 | Gomez | G06F 11/2236 714/727 |
| 2010/0287424 | A1* | 11/2010 | Kwon | G06F 9/4401 714/718 |

(Continued)

OTHER PUBLICATIONS

Blaquiere, Design and Validation of a Novel Reconfigurable and Defect Tolerant JTAG Scan Chain, IEEE, Conference Paper, pp. 2559-2562. (Year: 2014).*

*Primary Examiner* — April Y Blair
*Assistant Examiner* — Dipakkumar B Gandhi
(74) *Attorney, Agent, or Firm* — WPAT, P.C., Intellectual Property Attorneys; Anthony King

(57) ABSTRACT

A computer system includes a circuit board, one or more electronic components and a board management controller (BMC). The electronic components are disposed on the circuit board. The BMC is disposed on the circuit board and electrically connected to the one or more electronic components. The BMC is configured to enable/initiate a boundary scan test for the one or more electronic component.

20 Claims, 3 Drawing Sheets

(56) References Cited

U.S. PATENT DOCUMENTS

| | | | |
|---|---|---|---|
| 2012/0033396 A1* | 2/2012 | Goedknegt | H02B 1/28 361/807 |
| 2014/0108846 A1* | 4/2014 | Berke | G06F 1/28 713/340 |
| 2014/0268973 A1* | 9/2014 | Connolly | G11C 5/04 365/63 |
| 2016/0085290 A1* | 3/2016 | Skandakumaran | G06F 1/3253 713/320 |
| 2017/0184669 A1* | 6/2017 | Song | G06F 11/273 |
| 2018/0210517 A1* | 7/2018 | Yun | G06F 1/181 |

* cited by examiner

DEVICE AND METHOD FOR TESTING A COMPUTER SYSTEM

BACKGROUND

1. Technical Field

The subject application relates to a device and a method of performing a test on a computer system.

2. Description of the Related Art

To ensure a stable and normal operation of a computer system (e.g., a server, a personal computer, a laptop, a mobile computing device, etc.), some tests are performed on the computer system. As the complexity of electronic components (or integrated circuits) on circuit boards (e.g., motherboards, printed circuit boards (PCBs) or the like) continues to increase, a single circuit board may have a large number of electronic components. Therefore, it is challenging in testing the circuit boards or electronic components and debugging faults thereof in an efficient manner.

To reduce the burden of testing the circuit boards or electronic components, boundary scan testing can be implemented. Boundary scan testing uses a plurality of shift registers that are built into each integrated circuit. A boundary scan controller circuit is incorporated into each integrated circuit to control the transfer of data serially from one register to another. Therefore, it allows testing of internal logic circuitry to be conducted from external terminals, obviating the need for probes and other instrumentation.

In some approaches, Joint Test Action Group (JTAG) can be used to perform the boundary scan testing. The JTAG boundary scan test can connect the electronic components to be tested from different manufacturers in a serial chain. For example, the electronic components on a circuit board may include a JTAG port (or JTAG controller), and the JTAG ports of the electronic components to be tested are connected in a serial chain. The circuit board also has a JTAG header (or connector). To enable or initiate a JTAG boundary test for the circuit board or the electronic components, a JTAG master device has to be inserted or plugged into the JTAG header, and then the signal can be transmitted between the electronic components to be tested through the chain defined by the JTAG ports.

However, since an additional device (e.g., JTAG master device) is required for the JTAG boundary scan test, the cost for testing the circuit board or the electronic components would be increased. In addition, if there are multiple circuit boards to be tested, the JTAG master device should be removed from the JTAG header of a circuit board that the test has been completed and then plugged into the JTAG header of another circuit board, which would increase the time for testing the circuit boards. To save the time for testing, more than one JTAG master devices can be used, however, this will increase the cost for testing.

SUMMARY

In accordance with some embodiments of the subject application, a computer system includes a circuit board, one or more electronic components and a board management controller (BMC). The electronic components are disposed on the circuit board. The BMC is disposed on the circuit board and electrically connected to the one or more electronic components. The BMC is configured to enable/initiate a boundary scan test for the one or more electronic component.

In accordance with some embodiments of the subject application, a method for testing multiple electronic components of a computer system includes (a) enabling a board management controller (BMC) to initiate a boundary scan test, wherein the BMC is electrically connected to the multiple electronic components; and (b) providing test data by the BMC to at least one of the electronic components.

Figure 1:
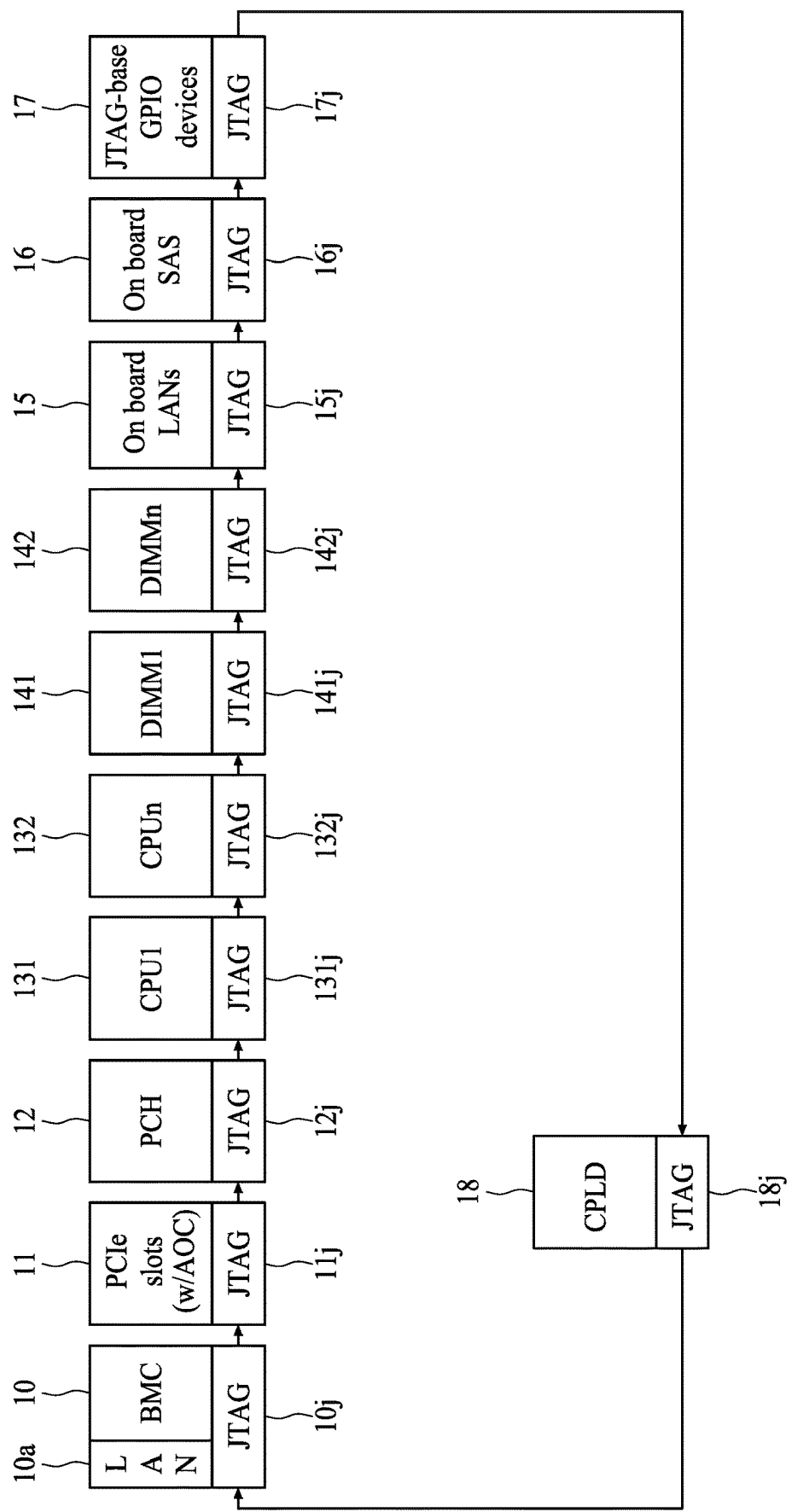
FIG. 1 is a block diagram system illustrating a device under test (DUT) in accordance with some embodiments of the subject application.

Common reference numerals are used throughout the drawings and the detailed description to indicate the same or similar components. The subject application will be more apparent from the following detailed description taken in conjunction with the accompanying drawings.

DETAILED DESCRIPTION

FIG. 1 is a block diagram system illustrating a device under test (DUT) 100 in accordance with some embodiments of the subject application. The DUT 100 may include but is not limited to, for example, a computer system (e.g., a server, a data center which includes a number of servers, a personal computer, a laptop, a mobile computing device, etc.) or a part of the computer system. The DUT 100 has a circuit board (e.g., motherboard, printed circuit board (PCB) or the like) on which a plurality of electronic components or integrated circuits are disposed.

As shown in FIG. 1, the DUT 100 includes a board management controller (BMC) 10, PCI-Express (PCI-E) slots 11, a Platform Controller Hub (PCH) 12, processors 131, 132, Dual In-line Memory Modules (DIMM) 141, 142, an onboard local area network (LAN) controller 15, an onboard Serial Attached SCSI (SAS) controller 16, a JTAG-base General-Purpose IO ports (GPIO) device 17 and a complex programmable logic device (CPLD) 18. In some embodiments, the type, number or the arrangement of the electronic components can be changed depending on different design requirements.

In some embodiments, the above electronic components include individual JTAG ports (or interfaces) 10j, 11j, 12j, 131j, 132j, 141j, 142j, 15j, 16j, 17j and 18j. The JTAG ports of the electronic components of the DUT 100 are electrically connected for data or signal transmission. For example, the JTAG ports (or interfaces) 10j, 11j, 12j, 131j, 132j, 141j, 142j, 15j, 16j, 17j and 18j of the BMC 10, the PCI-E slots 11, the PCH 12, the processors 131, 132, the DIMMs 141, 142, the onboard LAN controller 15, the onboard SAS controller 16, the JTAG-base GPIO device 17 and the CPLD 18 are connected in a chain (e.g., a series chain). In some embodiments, the JTAG ports of the electronic components are connected in a "daisy chain" configuration to form a single serial path. In other embodiments, the JTAG ports of the electronic components can be connected in any other configurations depending on different design requirements.

In some embodiments, the connection sequence of the electronic components can be changed depending on different design requirements.

In some embodiments, the JTAG port of each of the BMC 10, the PCIe slots 11, the PCH 12, the processors 131, 132, the DIMMs 141, 142, the onboard LAN controller 15, the onboard SAS controller 16, the JTAG-base GPIO device 17 and the CPLD 18 may incorporate a number of input/output ("I/O") pins for interconnecting the internal logic thereof to other electronic devices and circuitry. For example, each of the BMC 10, the PCI-E slots 11, the PCH 12, the processors 131, 132, the DIMMs 141, 142, the onboard LAN controller 15, the onboard SAS controller 16, the JTAG-base GPIO device 17 and the CPLD 18 may include a test data input (TDI) pin, a test data output (TDO) pin, a test clock pin and the like. In some embodiments, the TDI pin of each of electronic components is configured to receive test data or signal. The TDO pin of each of the electronic component is configured to output the test data or signal. The test clock pin of each of the electronic component is configured to receive clock signal.

The BMC 10 is configured to initiate a boundary scan test for the electronic components and/or the circuit board of the computer system. For example, the BMC 10 can be configured to operate the computer system in a boundary test mode. For example, the BMC 10 is configured to send test data to the next electronic component (e.g., PCI-E slots 11 as shown in FIG. 1) connected to the BMC 10. In some embodiments, the command or instruction for initiating the boundary scan test can be provided to the BMC 10 through a LAN port 10a of the BMC 10. In other words, the boundary scan test of the computer system can be initiated or enabled remotely, which renders the boundary scan test of the computer system more flexible and convenient.

In the boundary test mode, test data are provided to the boundary scan chain. For example, the test data may be provided by the BMC 10 to the TDI pin of the PCI-E slots 11, while a clock signal is provided to the test clock pins of the BMC 10, the PCI-E slots 11, the PCH 12, the processors 131, 132, the DIMMs 141, 142, the onboard LAN controller 15, the onboard SAS controller 16, the JTAG-base GPIO device 17 and the CPLD 18. The test of the PCI-E slots 11 can be completed in a predetermined number of the clocks, and then the test data is outputted from the TDO pin of the PCI-E slots 11 and inputted to the TDI pin of the PCH 12. Similarly, the test of the PCH 12 can be completed in a predetermined number of the clocks, and the test data is then transmitted to the next electronic component (e.g., the processor 131) on and on until all the electronic components to be tested have been tested. The test data will be transmitted through all the electronic components to be tested to check the functionality thereof.

According to the embodiment of FIG. 1, the boundary scan test for the computer system can be carried out or enabled by the BMC 10, which is generally included in the computer system, without using any additional device (e.g., a JTAG master device), which can reduce the cost for testing the computer system. In addition, since the BMC 10 includes a LAN port 10a, the boundary scan test of the computer system can be initiated or enabled remotely, which renders the boundary scan test of the computer system more flexible and convenient. Moreover, more than one computer systems can be tested simultaneously, the time required for testing the computer systems can be reduced.

Figure 2:
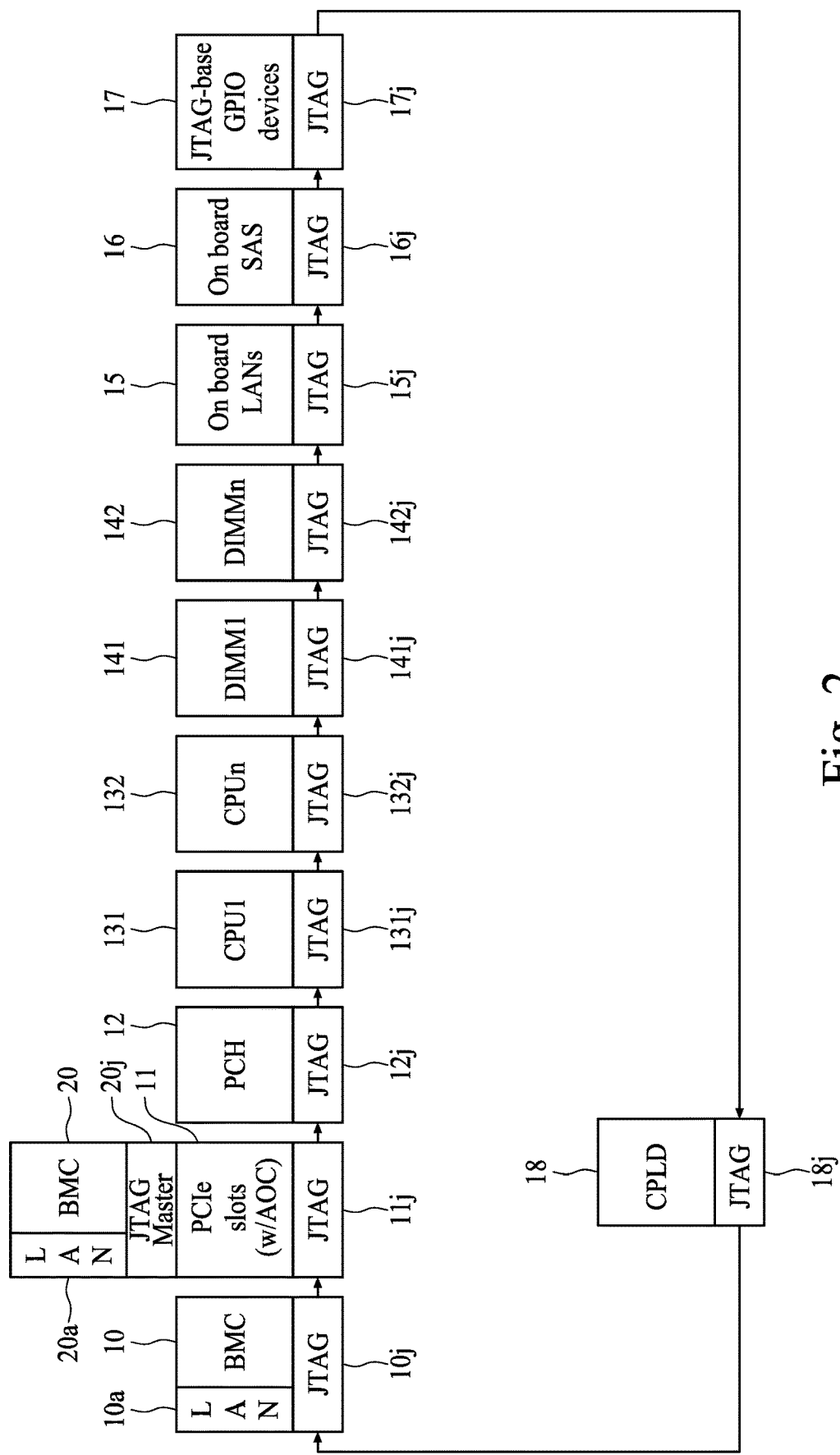
FIG. 2 is a block diagram system illustrating a device under test (DUT) in accordance with some embodiments of the subject application.

FIG. 2 is a block diagram system illustrating a device under test (DUT) 200 in accordance with some embodiments of the subject application. The DUT 200 may include but is not limited to, for example, a computer system (e.g., a server, a data center which includes a number of servers, a personal computer, a laptop, a mobile computing device, etc.) or a part of the computer system. The DUT 200 has a circuit board (e.g., motherboard, printed circuit board (PCB) or the like) on which a plurality of electronic components or integrated circuits are disposed. The DUT 200 in FIG. 2 is similar to the DUT 100 in FIG. 1 and one of the main differences is that the DUT 200 in FIG. 2 further includes a BMC 20.

The BMC 20 is connected to or inserted into PCI-Express (PCI-E) slots 11. The BMC 20 includes a JTAGE port functioning as a JTAG master, and thus the BMC 20 is configured to initiate a boundary scan test for the electronic components and/or the circuit board of the computer system. In some embodiments, the JTAG port of each of the BMC 10, the PCI-E slots 11, the PCH 12, the processors 131, 132, the DIMMs 141, 142, the onboard LAN controller 15, the onboard SAS controller 16, the JTAG-base GPIO device 17 and the CPLD 18 may incorporate a number of input/output ("I/O") pins for interconnecting the internal logic thereof to other electronic devices and circuitry. For example, each of the BMC 10, the PCI-E slots 11, the PCH 12, the processors 131, 132, the DIMMs 141, 142, the onboard LAN controller 15, the onboard SAS controller 16, the JTAG-base GPIO device 17 and the CPLD 18 may include a TDI pin, a test data output TDO pin, a test clock pin and the like. In some embodiments, the TDI pin of each of electronic components is configured to receive test data or signal. The TDO pin of each of the electronic component is configured to output the test data or signal. The test clock pin of each of the electronic component is configured to receive clock signal.

In some embodiments, the BMC 20 is configured to operate the computer system in a boundary test mode. For example, the BMC 20 is configured to send test data though the JTAG port 11j of the PCI-E slot 11 to the JTAG port of the next electronic component (e.g., PCH 12 as shown in FIG. 2). In some embodiments, the command or instruction for initiating the boundary scan test can be provided to the BMC 20 through a LAN port 20a of the BMC 20. In other words, the boundary scan test of the computer system can be initiated or enabled remotely, which renders the boundary scan test of the computer system more flexible and convenient.

In the boundary test mode, test data are provided to the boundary scan chain. For example, the test data may be provided by the BMC 20 to the TDI pin of the PCH 12, while a clock signal is provided to the test clock pins of the BMC 10, the PCH 12, the processors 131, 132, the DIMMs 141, 142, the onboard LAN controller 15, the onboard SAS controller 16, the JTAG-base GPIO device 17 and the CPLD 18. The test of the PCH 12 and/or the processor 131 can be completed in a predetermined number of the clocks, and then the test data is outputted from the TDO pin of the PCH 12 and respectively inputted to the TDI pin of the processor 131. Similarly, the test of the processor 131 can be completed in a predetermined number of the clocks, and the test data is then transmitted to the next electronic component (e.g., processor 132) on and on until all the electronic components to be tested have been tested. The test data will be transmitted through all the electronic components to be tested to check the functionality thereof.

According to the embodiment of FIG. 2, since the boundary scan test for the computer system is carried out or enabled by an addition BMC 20, which is inserted into the PCE-E slot 11, the BMC 10 can be tested under the boundary scan test. In addition, since the BMC 20 includes a LAN port 20a, the boundary scan test of the computer system can be initiated or enabled remotely, which renders the boundary scan test of the computer system more flexible and convenient. Moreover, more than one computer systems can be tested simultaneously, the time required for testing the computer systems can be reduced.

Figure 3:
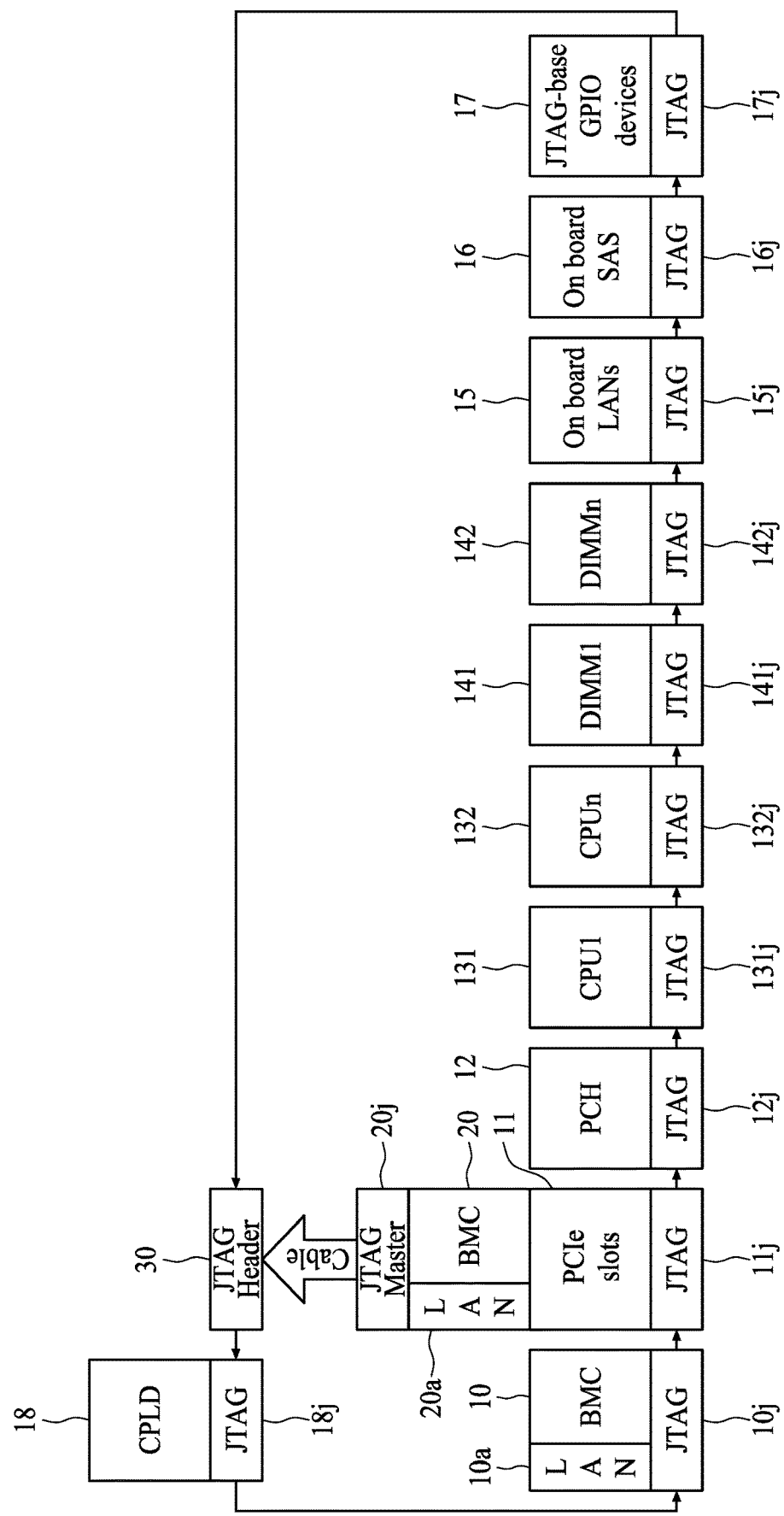
FIG. 3 is a block diagram system illustrating a device under test (DUT) in accordance with some embodiments of the subject application.

FIG. 3 is a block diagram system illustrating a device under test (DUT) 300 in accordance with some embodiments of the subject application. The DUT 300 may include but is not limited to, for example, a computer system (e.g., a server, a data center which includes a number of servers, a personal computer, a laptop, a mobile computing device, etc.) or a part of the computer system. The DUT 300 has a circuit board (e.g., motherboard, printed circuit board (PCB) or the like) on which a plurality of electronic components or integrated circuits are disposed. The DUT 300 in FIG. 3 is similar to the DUT 200 in FIG. 2 and main differences will be described below.

The BMC 20 is connected to or inserted into PCI-Express (PCI-E) slot 11 to receive the power from the PCI-E slot 11. The JTAG 20j of the BMC 20 is further connected to a JTAG header 30 disposed on the circuit board. The BMC 20 is configured to initiate a boundary scan test for the electronic components and/or the circuit board of the computer system by sending test through the JTAG header 30. In some embodiments, the JTAG port of each of the BMC 10, the PCI-E slots 11, the PCH 12, the processors 131, 132, the DIMMs 141, 142, the onboard LAN controller 15, the onboard SAS controller 16, the JTAG-base GPIO device 17 and the CPLD 18 may incorporate a number of input/output ("I/O") pins for interconnecting the internal logic thereof to other electronic devices and circuitry. For example, each of the BMC 10, the PCI-E slots 11, the PCH 12, the processors 131, 132, the DIMMs 141, 142, the onboard LAN controller 15, the onboard SAS controller 16, the JTAG-base GPIO device 17 and the CPLD 18 may include a TDI pin, a test data output TDO pin, a test clock pin and the like. In some embodiments, the TDI pin of each of electronic components is configured to receive test data or signal. The TDO pin of each of the electronic component is configured to output the test data or signal. The test clock pin of each of the electronic component is configured to receive clock signal.

In some embodiments, the BMC 20 is configured to operate the computer system in a boundary test mode. For example, the BMC 20 is configured to send test data though the JTAG header 30 to the JTAG port of the next electronic component (e.g., CPLD as shown in FIG. 3). In some embodiments, the command or instruction for initiating the boundary scan test can be provided to the BMC 20 through a LAN port 20a of the BMC 20. In other words, the boundary scan test of the computer system can be initiated or enabled remotely, which renders the boundary scan test of the computer system more flexible and convenient.

In the boundary test mode, test data are provided to the boundary scan chain. For example, the test data may be provided by the BMC 20 to the TDI pin of the CPLD 18, while a clock signal is provided to the test clock pins of the BMC 10, the PCH 12, the processors 131, 132, the DIMMs 141, 142, the onboard LAN controller 15, the onboard SAS controller 16, the JTAG-base GPIO device 17 and the CPLD 18. The test of the CPLD 18 can be completed in a predetermined number of the clocks, and then the test data is outputted from the TDO pin of the CPLD 18 and inputted to the TDI pin of the BMC 10. Similarly, the test of the BMC 10 can be completed in a predetermined number of the clocks, and the test data is then transmitted to the next electronic component on and on until all the electronic components to be tested have been tested. The test data will be transmitted through all the electronic components to be tested to check the functionality thereof.

According to the embodiment of FIG. 3, since the PCI-E slot 11 is only used to provide power for the BMC 20 and the test data is transmitted from the BMC 20 through the JTAG header 30 to the electronic components in the computer system, the PCI-E slot 11 can be tested under the boundary scan test. In addition, since the BMC 20 includes a LAN port 20a, the boundary scan test of the computer system can be initiated or enabled remotely, which renders the boundary scan test of the computer system more flexible and convenient. Moreover, more than one computer systems can be tested simultaneously, the time required for testing the computer systems can be reduced.

While the subject application has been described and illustrated with reference to specific embodiments thereof, these descriptions and illustrations do not limit the subject application. It can be clearly understood by those skilled in the art that various changes may be made, and equivalent elements may be substituted within the embodiments without departing from the true spirit and scope of the subject application as defined by the appended claims. The illustrations may not necessarily be drawn to scale. There may be distinctions between the artistic renditions in the subject application and the actual apparatus, due to variables in manufacturing processes and such. There may be other embodiments of the subject application which are not specifically illustrated. The specification and drawings are to be regarded as illustrative rather than restrictive. Modifications may be made to adapt a particular situation, material, composition of matter, method, or process to the objective, spirit and scope of the subject application. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the subject application. Therefore, unless specifically indicated herein, the order and grouping of the operations are not limitations of the subject application.

What is claimed is:

1. A computer system, comprising:
a circuit board;
one or more electronic components disposed on the circuit board;
a PCI-E slot disposed on the circuit board;
a first board management controller (BMC) inserted in the PCI-E slot and electrically connected to the one or more electronic components; and
a JTAG header,
wherein the one or more electronic components comprises a second BMC disposed on the circuit board,
wherein the first BMC is configured to enable/initiate a boundary scan test for the one or more electronic components, and wherein the first BMC is configured to transmit test data to a first electronic component of the one or more electronic components, and the first electronic component is configured to transmit the test data to a second electronic component of the one or more electronic components,
wherein a JTAG of the first BMC is electrically connected to the JTAG header and the first BMC is configured to transmit the test data to the one or more electronic components through the JTAG header, wherein the at least one of the one or more electronic components is configured to transmit the test data to the PCI-E slot for testing the PCI-E slot.

2. The computer system of claim 1, wherein the first BMC includes a Joint Test Action Group (JTAG) port electrically connected to a JTAG port of at least one of the electronic components.

3. The computer system of claim 2, wherein the first BMC is configured to transmit the test data to the one or more electronic components through the JTAG port.

4. The computer system of claim 1, wherein the first BMC includes a local area network (LAN) module configured to receive a command to enable/initiate the boundary scan test.

5. The computer system of claim 1, wherein the one or more electronic components include at least one of the following: a Platform Controller Hub (PCH), a processor, a Dual In-line Memory Module (DIMM), an onboard LAN controller, an onboard Serial Attached SCSI (SAS) controller, a JTAG-based General-Purpose IO port (GPIO) device and a complex programmable logic device (CPLD).

6. The computer system of claim 1, wherein the PCI-E slot includes a JTAG port electrically connected to a JTAG port of at least one of the electronic components.

7. The computer system of claim 6, wherein the first BMC is configured to transmit the test data to the one or more electronic components through the JTAG port of the PCI-E slot.

8. The computer system of claim 7, wherein the second BMC has a JTAG configured to receive the test data.

9. The computer system of claim 1, wherein the PCI-E slot is only used to provide power for the first BMC.

10. The computer system of claim 1, wherein the JTAG of the first BMC is configured to function as a JTAG master.

11. A method for testing a computer system, the computer system including a JTAG header and multiple electronic components that comprise a PCI-E slot, the method comprising: (a) enabling a first board management controller (BMC) to initiate a boundary scan test, wherein the first BMC is inserted into the PCI-E slot and electrically connected to the multiple electronic components; (b) providing test data by the first BMC to a first electronic component of the electronic components; and (c) providing the test data by the first electronic component to a second electronic component of the electronic components, wherein the multiple electronic components comprise a second BMC wherein a JTAG of the first BMC is electrically connected to the JTAG header and the first BMC is configured to transmit the test data to the electronic components through the JTAG header, wherein the at least one of the multiple electronic components is configured to transmit the test data to the PCI-E slot for testing the PCI-E slot.

12. The method of claim 11, wherein the first BMC includes a Joint Test Action Group (JTAG) port electrically connected to a JTAG port of at least one of the electronic components.

13. The method of claim 12, wherein the first BMC is configured to transmit the test data to the multiple electronic components through the JTAG port.

14. The method of claim 11, wherein operation (a) further comprises receiving a command to initiate the boundary scan test.

15. The method of claim 14, wherein the first BMC includes a local area network (LAN) module configured to receive the command.

16. The method of claim 11, wherein the multiple electronic components include at least one of the following: a Platform Controller Hub (PCH), a processor, a Dual In-line Memory Module (DIMM), an onboard LAN controller, an onboard Serial Attached SCSI (SAS) controller, a JTAG-based General-Purpose IO port (GPIO) device and a complex programmable logic device (CPLD).

17. The method of claim 11, wherein the PCI-E slot includes a JTAG port electrically connected to a JTAG port of at least one of the electronic components.

18. The method of claim 17, wherein the first BMC is configured to transmit the test data to the multiple electronic components through the JTAG port of the PCI-E slot.

19. The method of claim 11, wherein the PCI-E slot is only used to provide power for the first BMC.

20. The method of claim 11, wherein the JTAG of the first BMC is configured to function as a JTAG master.

* * * * *